(12) United States Patent
Kozono

(10) Patent No.: US 6,608,387 B2
(45) Date of Patent: Aug. 19, 2003

(54) SEMICONDUCTOR DEVICE FORMED BY MOUNTING SEMICONDUCTOR CHIP ON SUPPORT SUBSTRATE, AND THE SUPPORT SUBSTRATE

(75) Inventor: Hiroyuki Kozono, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/078,391

(22) Filed: Feb. 21, 2002

(65) Prior Publication Data

US 2002/0125560 A1 Sep. 12, 2002

(30) Foreign Application Priority Data

Feb. 23, 2001 (JP) ......................................... 2001-048002

(51) Int. Cl.[7] ......................... H01L 23/48; H01L 23/52; H01L 29/40
(52) U.S. Cl. ...................... 257/782; 257/783; 257/784; 257/787
(58) Field of Search ............................... 257/783, 698, 257/782, 787, 784

(56) References Cited

U.S. PATENT DOCUMENTS

| | | | |
|---|---|---|---|
| 5,311,056 A | 5/1994 | Wakabayashi et al. ...... | 257/666 |
| 6,054,773 A | * 4/2000 | Ohsawa et al. | |
| 6,107,676 A | 8/2000 | Suzuki ........................ | 257/666 |
| 6,169,329 B1 | 1/2001 | Farnworth et al. .......... | 257/780 |
| 6,433,440 B1 | * 8/2002 | Ogino et al. | |

* cited by examiner

*Primary Examiner*—Sheila V. Clark
(74) *Attorney, Agent, or Firm*—Finnegan, Henderson, Farabow, Garrett & Dunner, L.L.P.

(57) ABSTRACT

A semiconductor device includes a support member having first and second major surfaces and an elongate hole extending between the first and second major surfaces. The hole has first and second elongate edges extending along a side of the support member and opposed to each other. A plurality of first and second external connection terminals is provided along each of the first and second edges. The first and second external connection terminals each have one end located above the second major surface of the support member. A semiconductor chip is provided on the first major surface of the support member. The semiconductor chip includes connection pads arranged along the hole. The connection pads are electrically connected to the other ends of the first and second external connection terminals by first and second connection wires, respectively. The hole is filled with an insulation material.

14 Claims, 4 Drawing Sheets

SEMICONDUCTOR DEVICE FORMED BY MOUNTING SEMICONDUCTOR CHIP ON SUPPORT SUBSTRATE, AND THE SUPPORT SUBSTRATE

CROSS-REFERENCE TO RELATED APPLICATIONS

This application is based upon and claims the benefit of priority from the prior Japanese Patent Application No. 2001-048002, filed Feb. 23, 2001, the entire contents of which are incorporated by reference.

BACKGROUND OF THE INVENTION

1. Field of the Invention

The present invention relates to a semiconductor device formed by mounting a semiconductor chip on a support substrate, using the inner lead bonding (hereinafter referred to as an "ILB"), and to the support substrate.

2. Description of the Related Art

FIG. 6 is a plan view illustrating a conventional semiconductor device viewed from the bottom. For facilitating the explanation, FIG. 6 does not show a resin. FIG. 7 is a sectional view taken along line VIB–VIB' in FIG. 6.

As shown in FIGS. 6 and 7, a support substrate 31 includes a support member 42 formed of a square insulation tape. The support member 42 has a pair of slim device holes 41 extending along a pair of opposite sides of the member and pierced through the thickness of the member.

A plurality of finger leads 44 made of, for example, Cu foil plated with Au, are provided in a predetermined pattern on the upper surface of the support member 42. The finger leads 44 are fixed to the support member 42 by an adhesive 43. Each finger lead 44 has one end reaching a corresponding device hole 41, and the other end extending to the device holes 41. Each finger lead 44, except for the one end, and the upper surface of the support member 42 are coated with a solder resist 45.

Solder balls 35, serving as external terminals, are arranged in a matrix on the lower surface of the member 42 between the pair of device holes 41. The distance between each pair of adjacent solder balls is d2. Each solder ball 35 is electrically connected to the other end of a corresponding finger lead 44 via a corresponding through hole 46 formed in the support member 42.

A semiconductor chip 32 such as an integrated circuit is provided and fixed on the upper surface of the support substrate 31, with a cushion member 33 interposed therebetween. Each electrode pad 47 of the semiconductor chip 32 is electrically connected to a corresponding finger lead 44. The connection between the finger leads 44 and the semiconductor chip 32 is executed using an ILB device. For example, after aligning the finger leads 44 with the electrode pads 47 of the semiconductor chip 32, they are simultaneously coupled by thermocompression bonding, using a bonding tool.

A resin 34 is filled between the semiconductor chip 32 and the support substrate 31 through the device holes 41 from the lower surface of the substrate 31, thereby sealing upper surface portions of the support substrate 31, those portions of the finger leads 44, which are located in the device holes 41, side surface portions of the chip 32, and those surface portions of the substrate 31, which are opposed to the chip.

FIG. 8 is a plan view illustrating finger leads 44 formed on the support member 42. This figure shows a state assumed before the finger leads 44 are electrically connected to the electrode pads 47 of the semiconductor chip 32. Each finger lead 44 bridges the device hole 41 from one edge portion to the other edge portion of the hole. Each finger lead 44 has one end connected to one end of any other finger lead 44, and the other end formed circular and provided over a corresponding through hole 46 of the support member 42. Furthermore, each finger lead 44 has indented portions 441 located near the one edge portion of the device hole 41. When coupling the finger leads 44 to the semiconductor chip 32 by thermocompression bonding, each finger lead 44 is cut at the indented portions 441 and coupled to a corresponding electrode pad 47 by thermocompression.

However, when connecting a finger lead 44a to a solder ball 35 remote from the device hole 41, it is necessary to pass the finger lead between through holes 46a and 46b filled with solder balls 35 close to the device hole 41. If the through holes 46a and 46b are arranged with a narrow pitch, it is difficult to pass the finger lead 44a between the through holes.

In addition, to provide one or more finger leads 44 between through holes 46, it is necessary to secure a sufficient distance between the through holes 46 in light of the width of the finger lead(s). Accordingly, the distance d2 must be set large, which inevitably enlarges the entire semiconductor device.

The same problem will occur in the case where a device hole 41 is formed along each side of the support substrate 31, or where finger leads 44 are extended from external terminals arranged in three or more rows with respect to one device hole 41, like the uppermost and lowest row as shown in the FIG. 6.

BRIEF SUMMARY OF THE INVENTION

According to a first aspect of the invention, there is provided a semiconductor device comprising: a support member having first and second major surfaces and an elongate hole extending between the first and second major surfaces, the hole having first and second elongate edges opposite to each other; a plurality of first external connection terminals provided along the first edge of the hole, the first external connection terminals each having one end located above the second major surface of the support member; a plurality of second external connection terminals provided along the second edge of the hole, the second external connection terminals each having one end located above the second major surface of the support member; a semiconductor chip provided on the first major surface of the support member, the semiconductor chip including connection pads provided in a region corresponding to the hole; first and second connection wires which electrically connect the connection pads to other ends of the first and second external connection terminals, respectively; and an insulation material filled in the hole.

According to a second aspect of the invention, there is provided a support substrate used to form a semiconductor device, together with a semiconductor chip provided on the support substrate, comprising: a support member having first and second major surfaces and an elongate hole extending between the first and second major surfaces, the hole having first and second elongate edges opposite to each other; a plurality of first external connection terminals provided along the first edge of the hole, the first external connection terminals each having one end located above the second major surface of the support member; a plurality of second external connection terminals provided along the second edge of the hole, the second external connection terminals each having one end located above the second major surface of the support member; and first and second connection wires formed of a conductive material, the first and second connection wires having respective first ends connected to the first and second external connection terminals, and second ends located above the hole.

DETAILED DESCRIPTION OF THE INVENTION

Figure 1:
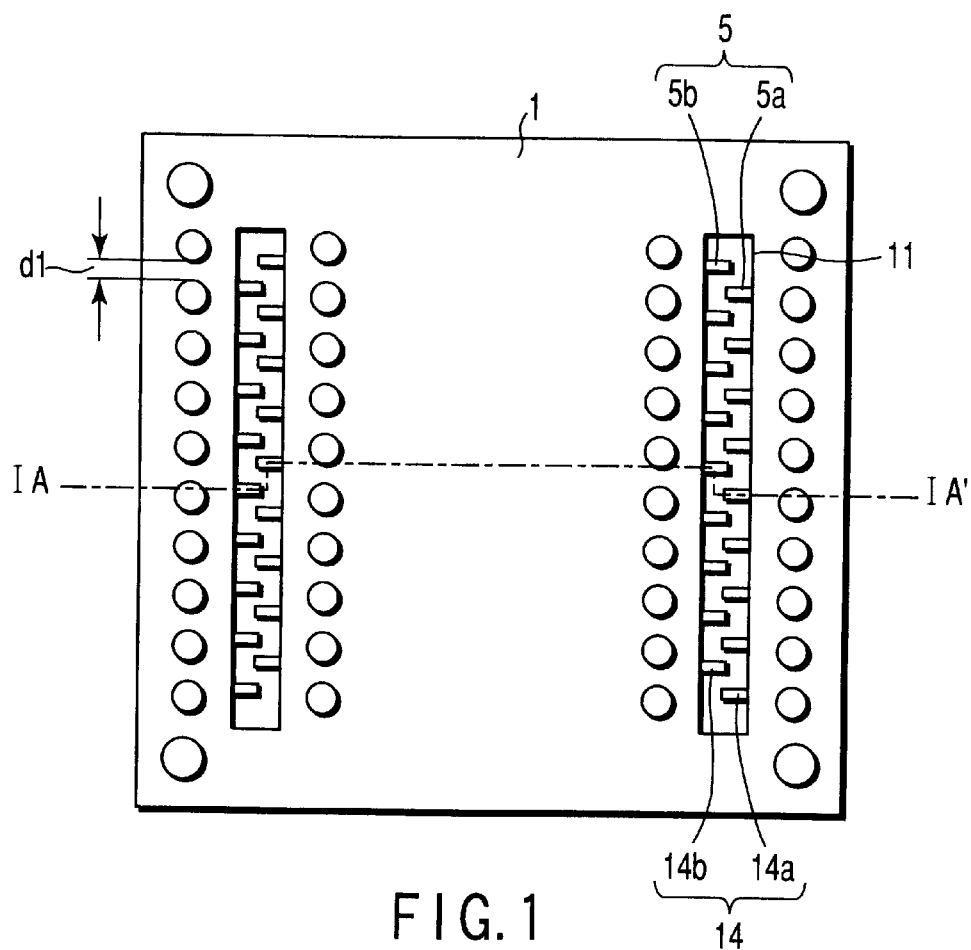
FIG. 1 is a plan view illustrating a semiconductor device, according to an embodiment of the invention, viewed from the bottom.

Reference will now be made in detail to the presently preferred embodiments of the invention as illustrated in the accompanying drawings, in which like reference characters designate like or corresponding parts throughout the several drawings. A duplicate explanation will be made only when necessary.

Semiconductor devices according to the embodiments of the invention employ finger leads alternately extending from the opposite edge portions of a device hole formed in a support substrate such as a TAB tape. The finger leads are electrically connected to a semiconductor chip by the ILB technique.

Figure 2:
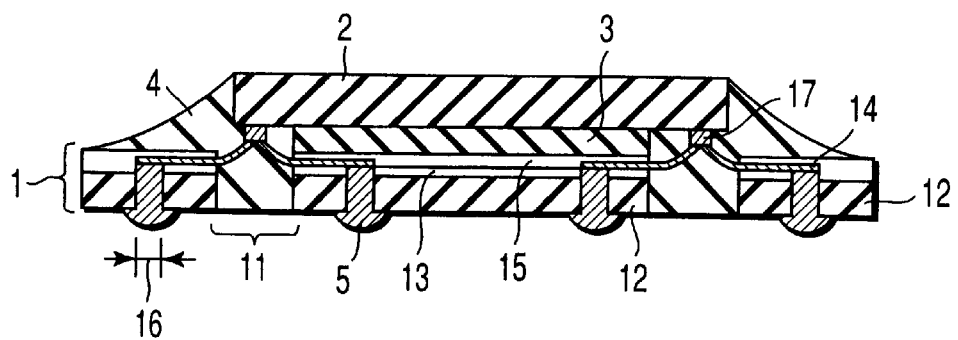
FIG. 2 is a sectional view illustrating the semiconductor device according to the invention.

FIG. 1 is a plan view illustrating a semiconductor device, according to an embodiment of the invention, viewed from the bottom. For facilitating the explanation, FIG. 1 does not show a resin. FIG. 2 is a sectional view taken along line IA–IA' in FIG. 1.

As shown in FIGS. 1 and 2, a support substrate 1 includes a support member 12 formed of a square insulation tape. The support member 12 has a pair of elongate device holes 11 extending along and adjacent to pair of opposite sides of the member 12 and pierced through the thickness of the member. Each device hole 11 is arranged with a predetermined distance from a corresponding side of the member 12. Solder balls 5 are provided on the lower surface of the support member 12 along the opposite elongate edges of each device hole 11. The solder balls 5 include solder balls 5a located along one of the elongate edges of each device hole 11, and solder balls 5b located along the other elongate edge of each device hole 11. The solder balls 5 serve as external terminals. The distance between each pair of adjacent solder balls is d1. Each solder ball 5 is received in a corresponding through hole 16 formed in the support member 12.

A plurality of finger leads (connection wires) 14 made of, for example, Cu foil plated with Au, are provided on the upper surface of the support member 12. The finger leads 14 are fixed to the support member 12 by an adhesive 13. Each finger lead 14 extends in a direction perpendicular to the axis of the device holes 11 (in the horizontal direction in FIG. 2). Each finger lead 14 has one end (free end) located in an upper portion of a corresponding device hole 11, and the other end located above a corresponding through hole 16 and electrically connected to a corresponding solder ball 5 received therein. The finger leads 14 include finger leads 14a connected to the respective solder balls 5a, and finger leads 14b connected to the respective solder balls 5b. The finger leads 14 alternately protrude from the opposite elongate edges of each device hole 11. Accordingly, the free ends of the finger leads 14 are alternately arranged in an upper portion of each device hole 11. Each finger lead 14, except for its free end, and the upper surface of the support member 12 are coated with a solder resist 15.

Figure 3:
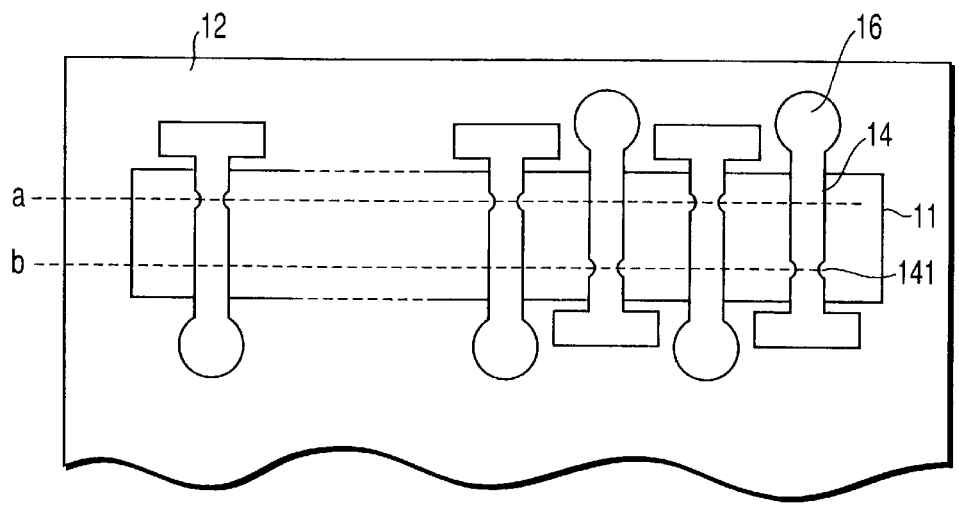
FIG. 3 is a plan view illustrating finger leads formed on a tape according to the invention.

FIG. 3 is a plan view of the finger leads 14 formed on the support member 12, showing a state assumed before the finger leads 14 are connected to a semiconductor chip 2. The finger leads 14 are T-shaped, have respective indented portions 141, bridge the device holes 11, and are arranged alternately in opposite directions. The other end of each finger lead 14 is formed circular above a corresponding through hole 16 provided in the support member 12. In each finger lead 14, the indented portions 141 are provided near the edge of a corresponding device hole 11, which is remote from a corresponding through hole 16. When coupling each finger lead 14 to the semiconductor chip 2 by thermocompression, the indented portions 141 are cut, and the cut end of each finger lead 14 is electrically connected to a corresponding electrode pad 17 of the semiconductor chip 2.

In FIG. 3, although two indented portions are formed at a position a and b of a linear portion of each finger lead 14 along the surface of the support member 12, it is sufficient if only one indented portion is provided. Alternatively, the indented portion(s) 141 may be provided in the thickness direction (perpendicular to the surface of the support member 12) of each finger lead 14. The indented portion(s) 141 makes it easy to cut the finger lead 14 upon thermocompression.

The semiconductor chip 2 such as an integrated circuit is attached to the support member 12, with a cushion member 3 interposed therebetween. The electrode pads 17 of the semiconductor chip 2 are electrically connected to the finger leads 14 by an ILB device. For example, after the finger leads 14 are aligned with the electrode pads 17 of the semiconductor chip 2, those portions of the finger leads 14, which are located in the device holes 11, are pressed toward the semiconductor chip 2. As a result, the finger leads 14 are cut at the indented portions 141, and the free ends of the finger leads 14 are coupled to the electrode pads 17 of the semiconductor chip 2 by thermocompression.

The cushion member 3 interposed between the support substrate 1 and the semiconductor chip 2 reduces the shock applied thereto upon thermocompression, and efficiently dissipates the heat generated by the semiconductor chip 2.

A resin (sealing material) 4 is filled between the support substrate 1 and the semiconductor chip 2 through the device holes 11 from the lower surface of the substrate 1, thereby sealing upper surface portions of the substrate 1, those portions of the finger leads 14, which are located in the device holes 11, side surface portions of the chip 2, and those surface portions of the substrate 1, which are opposed to the chip.

In the above-described embodiment, the solder balls 5 serving as external terminals are arranged at the opposite sides of each device hole 11, and the finger leads 14 are lead into the device holes 11 in the opposite directions. Therefore, it is not necessary to pass the finger leads 14 between the external terminals. This enables the distance d1 between each pair of adjacent solder balls in the embodiment to be made shorter than the distance d2 employed in the conventional case, due to the width of a finger lead (or finger leads) 14. As a result, the resultant semiconductor device can be made more compact.

Although in the above-described embodiment, one row of solder balls 5 are arranged along each side of each device hole 11, a plurality of rows (two or more) of solder balls may be provided along each side. In this case, even though a plurality of rows of solder balls are arranged, if the number of rows arranged in the embodiment is identical to that in the conventional case, the same advantage as above can be obtained, since the number of finger leads 14 to be passed between adjacent external terminals is smaller in the former case than in the latter case. Therefore, it is not necessarily needed to place the finger leads 14a and 14b alternately.

Further, although in the above-described embodiment, a pair of device holes 11 is formed in a pair of opposite sides of the substrate, a device hole may be formed in each of the four sides of the substrate. In this case, if solder balls 5 are arranged along each side of each device hole 11, the distance between each pair of adjacent external terminals can be further shortened, thereby further reducing the size of the resultant semiconductor device.

Figure 4:
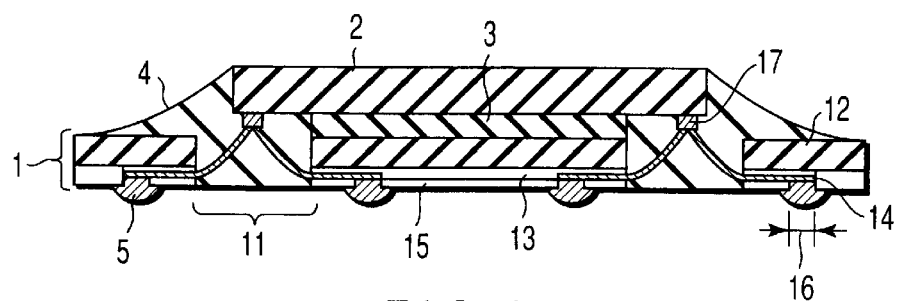
FIG. 4 is a sectional view illustrating a semiconductor device according to another embodiment of the invention.

Furthermore, although in the embodiment, the semiconductor chip 2 is provided and fixed on the solder resist 15 of the support substrate 1, the chip 2 may be provided and fixed on the support member 12 as shown in FIG. 4. In this case, the finger leads 14 are adhered to the support member 12 provided with the device holes 11, using the adhesive 13. The other ends of the finger leads 14 reach the device holes 11. The solder resist 15 is formed on the support member 12 except for the device holes 11 and the finger leads 14 on the support member 12. The through holes 16 are formed through the solder resist 15, enabling the free ends of the finger leads 14 to be electrically connected to the solder balls 5.

Also, although in the embodiment, the solder balls 5 are provided as external terminals in the through holes 16, embedded Cu-terminals, for example, may be used in place of the solder balls 5.

Figure 5:
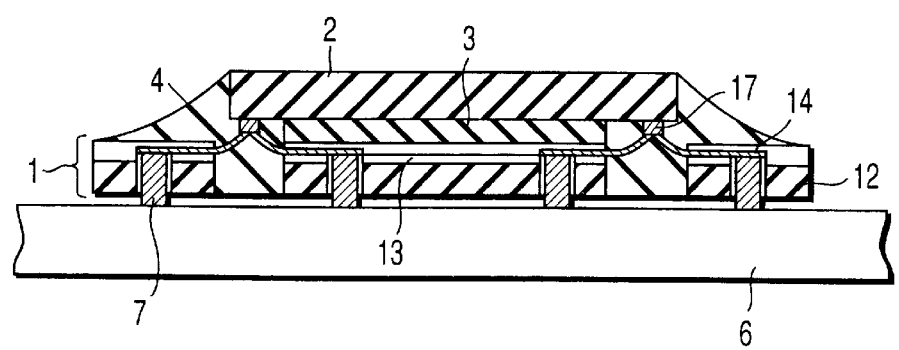
FIG. 5 is a sectional view illustrating a semiconductor device according to yet another embodiment of the invention.
Figure 6:
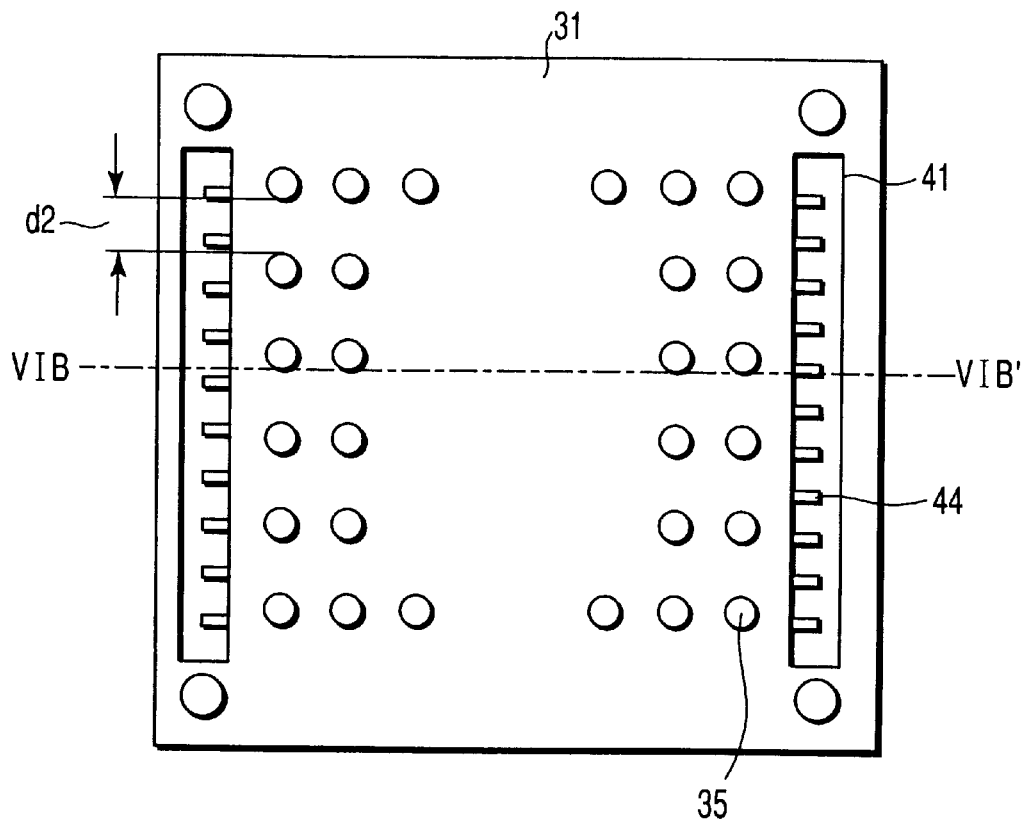
FIG. 6 is a plan view illustrating a conventional semiconductor device viewed from the bottom.
Figure 7:
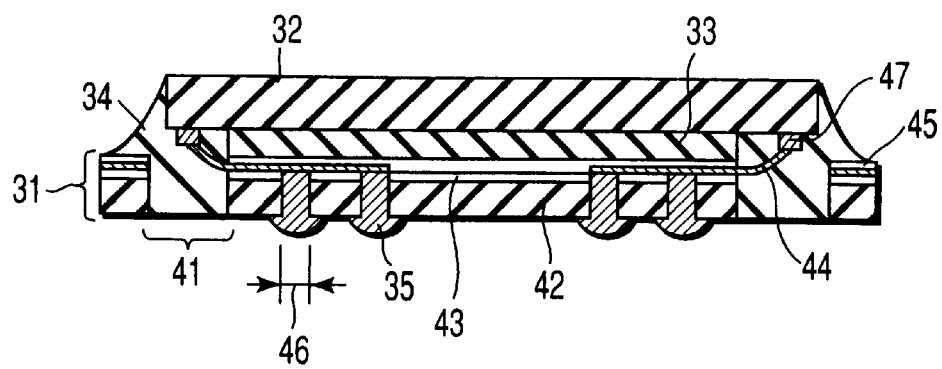
FIG. 7 is a sectional view illustrating the conventional semiconductor device.
Figure 8:
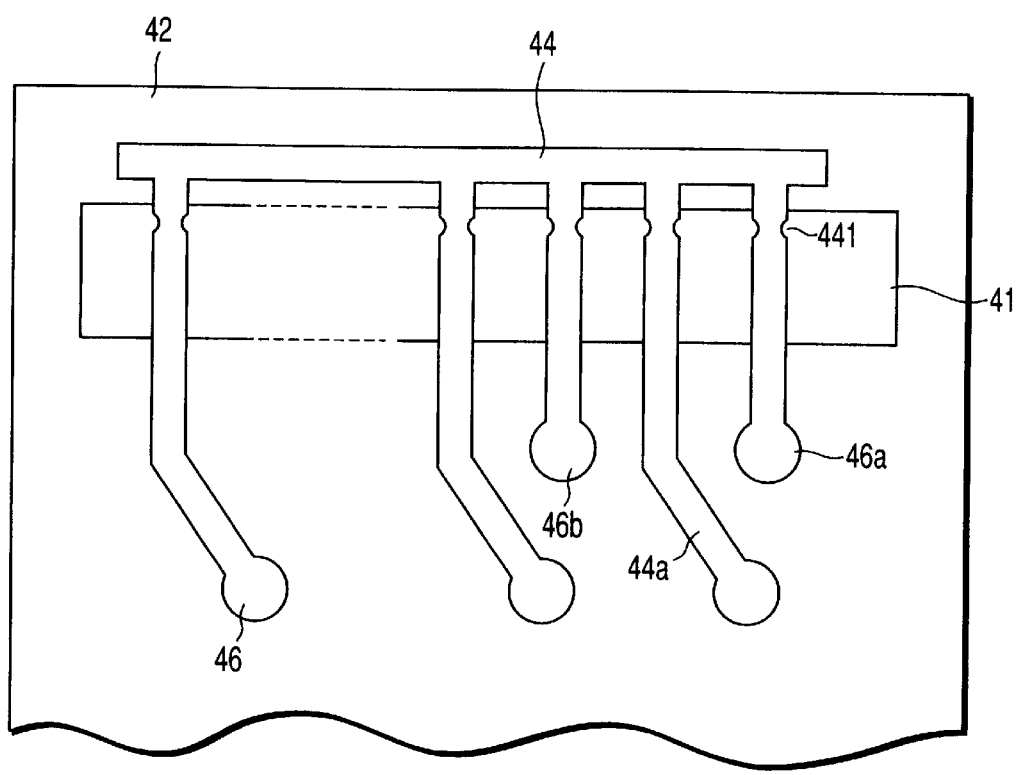
FIG. 8 is a plan view illustrating finger leads formed on a conventional tape.

In addition, if connection terminals such as bumps 7 are provided on a mount board 6 as shown in FIG. 5, it is not necessary to provide external terminals at the semiconductor device side.

It is not necessary that the cushion member 3 is always provided between the support substrate 1 and the semiconductor chip 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a support member having major and an hole first and second elongate extending between the first and second major surfaces, the hole having first and second elongate edges opposite each other;
   a plurality of first external connection terminals provided along the first edge of the hole, the first external connection terminals each having one end located above the second major surface of the support member;
   a plurality of second external connection terminals provided along the second edge of the hole, the second external connection terminals each having one end located above the second major surface of the support member;
   a semiconductor chip provided on the first major surfaces of the support member, the semiconductor chip including connection pads provided in a region corresponding to the hole;
   first and second connection wires electrically connect the connection pads to the other ends of the first and second external connection terminals, respectively, the first and second connection wires being alternately arranged above the hole; and
   an insulation material filled in the hole.

2. The semiconductor device according to claim 1, wherein the first and second external connection terminals extend through the support member such that the other ends are situated on the first major surface of the support member, and the first and second connection wires are provided on the first major surface of the support member such that they are situated between the support member and the semiconductor chip.

3. The semiconductor device according to claim 1, wherein the other ends of the first and second external connection terminals are situated on the second major surface of the support member, and the first and second connection wires are provided on the second major surface of the support member.

4. The semiconductor device according to claim 1, wherein at least one pair of holes similar to the hole are formed in the support member such that they are opposed to each other and the holes are extending along and adjacent to sides of the support member.

5. The semiconductor device according to claim 1, wherein the support member is a tape.

6. The semiconductor device according to claim 1, further comprising a cushion member provided between the support member and the semiconductor chip.

7. The semiconductor device according to claim 1, wherein the first and second connection wires are formed of Cu foil plated with Au.

8. A support substrate used to form a semiconductor device, together with a semiconductor chip provided on the support substrate, comprising:
   a support member having first and second major surfaces and an elongate hole extending between the first and second major surfaces, the hole having first and second edges opposite to each other;
   a plurality of first external connection terminals provided along the first edge of the hole, the first external connection terminals each having one end located above the second major surface of the support member;
   a plurality of second external connection terminals provided along the first edge of the hole, the first external connection terminals each having one end located above the second major surface of the support member;
   a plurality of second external connection terminals provided along the second edge of the hole, the second external connection terminals each having one end located above the second major surface of the support member; and first and second connection wires formed of a conductive material, the first and second connection wires having respective first ends connected to the one ends of first and second external connection terminals respectively, and second ends located above the hole, the first and second connection wires being alternately arranged above the hole.

9. The support substrate according to claim 8, wherein the first and second external connection terminals extend through the support member such that the other end of each of the first and second external connection terminals is situated on the first major surface of the support member, and the first and second connection wires are provided on the first major surface of the support member.

10. The support substrate according to claim 8, wherein the other end of each of the first and second external connection terminals is situated on the second major surface of the support member, and the first and second connection wires are provided on the second major surface of the support member.

11. The support substrate according to claim 6, wherein at least one pair of holes similar to the hole are formed in the support member such that they are opposed to each other and the holes are extending along and adjacent to sides of the support member.

12. The support substrate according to claim 8, wherein the support member is a tape.

13. The support substrate according to claim 8, wherein the first and second connection wires are formed of Cu foil plated with Au.

14. The support substrate according to claim 8, wherein the second ends of the first and second connection wires bridge the hole, and each of the first and second connection wires has an indented portion located near the second end above the hole.

* * * * *

UNITED STATES PATENT AND TRADEMARK OFFICE
CERTIFICATE OF CORRECTION

PATENT NO.     : 6,608,387 B2
DATED          : August 19, 2003
INVENTOR(S)    : Kozono It is certified that error appears in the above-identified patent and that said Letters Patent is hereby corrected as shown below:

Column 5,
Lines 66-67, change "major and an hole first and second elongate" to -- first and second major surfaces and an elongate hole --.

Column 6,
Line 12, change "surfaces" to -- surface --.
Line 16, after "wires" insert -- which --.

Column 8,
Line 3, change "claim 6," to -- claim 8, --

Signed and Sealed this

Ninth Day of December, 2003

JAMES E. ROGAN
*Director of the United States Patent and Trademark Office*